(12) United States Patent
Lee et al.

(10) Patent No.: US 10,566,472 B2
(45) Date of Patent: Feb. 18, 2020

(54) SOLAR CELL

(75) Inventors: Giwon Lee, Seoul (KR); Jonghwan Kim, Seoul (KR); Juwan Kang, Seoul (KR); Kyoungsoo Lee, Seoul (KR); Manhyo Ha, Seoul (KR); Daehee Jang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 147 days.

(21) Appl. No.: 12/964,384

(22) Filed: Dec. 9, 2010

(65) Prior Publication Data
US 2011/0139239 A1 Jun. 16, 2011

(30) Foreign Application Priority Data
May 12, 2010 (KR) .................. 10-2010-0044568

(51) Int. Cl.
| H01L 31/0224 | (2006.01) |
| H01L 31/0236 | (2006.01) |
| H01L 31/0352 | (2006.01) |
| H01L 31/028 | (2006.01) |
| H01L 31/068 | (2012.01) |

(52) U.S. Cl.
CPC .......... *H01L 31/022433* (2013.01); *H01L 31/02363* (2013.01); *H01L 31/03529* (2013.01); *H01L 31/028* (2013.01); *H01L 31/068* (2013.01)

(58) Field of Classification Search
CPC ....... H01L 31/022433; H01L 31/02363; H01L 31/035281; H01L 31/02168; H01L 31/022425; H01L 31/068; H01L 31/0236; H01L 31/03529

USPC .................. 136/255, 256; 438/9, 71
See application file for complete search history.

(56) References Cited

U.S. PATENT DOCUMENTS

| 4,590,327 A * | 5/1986 | Nath et al. ................. 136/256 |
| 5,681,402 A * | 10/1997 | Ichinose et al. ............. 136/256 |
| 2003/0178057 A1* | 9/2003 | Fujii et al. ................. 136/256 |
| 2007/0175508 A1* | 8/2007 | Park .................. H01L 31/02168 |
| | | 136/256 |
| 2007/0209697 A1* | 9/2007 | Karakida .......... H01L 31/02363 |
| | | 136/256 |
| 2008/0149161 A1 | 6/2008 | Nishida et al. |

(Continued)

FOREIGN PATENT DOCUMENTS

| CN | 1437270 A | 8/2003 |
| EP | 0477424 A1 | 4/1992 |
| JP | 2002-164555 A | 6/2002 |

(Continued)

OTHER PUBLICATIONS

Ruby, Plasma Etching Texturing and Passivation of Silicon Solar Cells, 1999, AIP Conference Proceedings, 462, 430.*

*Primary Examiner* — Andrew J Golden
(74) *Attorney, Agent, or Firm* — Birch, Stewart, Kolasch & Birch, LLP

(57) ABSTRACT

A solar cell includes a substrate having a textured surface, the textured surface including a plurality of jagged portions; an emitter region forming a p-n junction with the substrate; a plurality of first electrodes connected to the emitter region; and a second electrode connected to the substrate, wherein each of the plurality of jagged portions has a diameter and a height that are equal to or less than 1 μm, and each of the plurality of first electrodes has a width of about 20 μm to about 80 μm.

18 Claims, 3 Drawing Sheets

(56) References Cited

U.S. PATENT DOCUMENTS

2009/0242013 A1* 10/2009 Taguchi ..................... 136/256
2009/0285979 A1   11/2009 Karakida et al.

FOREIGN PATENT DOCUMENTS

| KR | 10-2009-0118333 A | 11/2009 |
| KR | 10-2010-0012230 A | 2/2010 |
| WO | WO 2009/010585 A2 | 1/2009 |

* cited by examiner

SOLAR CELL

CROSS-REFERENCE TO RELATED APPLICATION

This application claims priority to and the benefit of Korean Patent Application No. 10-2010-0044568 filed in the Korean Intellectual Property Office on May 12, 2010, the entire contents of which are incorporated herein by reference.

BACKGROUND OF THE INVENTION

Field of the Invention

The present invention relates to a solar cell.

Description of the Related Art

Recently, as existing energy sources such as petroleum and coal are expected to be depleted, interests in alternative energy sources for replacing the existing energy sources are increasing. Among the alternative energy sources, solar cells generating electric energy from solar energy have been particularly spotlighted.

A solar cell generally includes semiconductors that form a p-n junction by different semiconductors of different conductive types from each other, such a p-type and an n-type, and electrodes connected to the semiconductors, respectively.

When light is incident on the solar cell, a plurality of electron-hole pairs are generated in the semiconductors. The electron-hole pairs are separated into electrons and holes by the photovoltaic effect. Thus, the separated electrons move to the n-type semiconductor and the separated holes move to the p-type semiconductor, The electrons and holes are respectively collected by the electrode electrically connected to the n-type semiconductor and the electrode electrically connected to the p-type semiconductor. The electrodes are connected to one another using electric wires to thereby obtain electric power.

SUMMARY OF THE INVENTION

According to an aspect of the present invention, a solar cell includes a substrate having a textured surface, the textured surface including a plurality of jagged portions; an emitter region forming a p-n junction with the substrate; a plurality of first electrodes connected to the emitter region; and a second electrode connected to the substrate, wherein each of the plurality of jagged portions has a diameter and a height that are equal to or less than 1 μm, and each of the plurality of first electrodes has a width of about 20 μm to about 80 μm.

The each of the plurality of first electrodes may have a height of 30 μm to 80 μm.

A distance between two adjacent first electrodes may be 1.6 mm to 2.0 mm.

The solar cell according to the aspect may further include a plurality of first electrode charge collectors connected to the emitter region and extending in a direction crossing the plurality of first electrodes.

Each of the plurality of first electrode charge collectors may have a height equal to or greater than a height of each of the plurality of first electrodes.

The ratio of a thickness of the each of the plurality of first electrodes with respect to a thickness of the each of the plurality of first electrode charge collectors may be 1:1 to 3.3.

The each of the plurality of first electrode charge collectors may have a thickness of about 35 μm to 100 μm.

The ratio of width of the each of the plurality of first electrodes with respect to a width of the each of the plurality of first electrode charge collectors may be 1:16.25 to 110.

The each of the plurality of first electrode charge collectors may have the width of about 1.3 mm to 2.2 mm.

The emitter region may have a sheet resistance of about 80 Ω/sq. to 150 Ω/sq.

The emitter region may have a thickness of about 150 nm to 450 nm from the textured surface of the substrate.

According to an aspect of the present invention, a solar cell includes a substrate having an textured surface, the textured surface comprising a plurality of jagged portions; an emitter region forming a p-n junction with the substrate; a plurality of first electrodes connected to the emitter region; and a second electrode connected to the substrate, wherein at least one of the plurality of first electrodes is formed over the plurality of jagged portions, and a number of the plurality of jagged portions disposed within a cross sectional width direction of the at least one of the plurality of first electrodes is at least 10.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
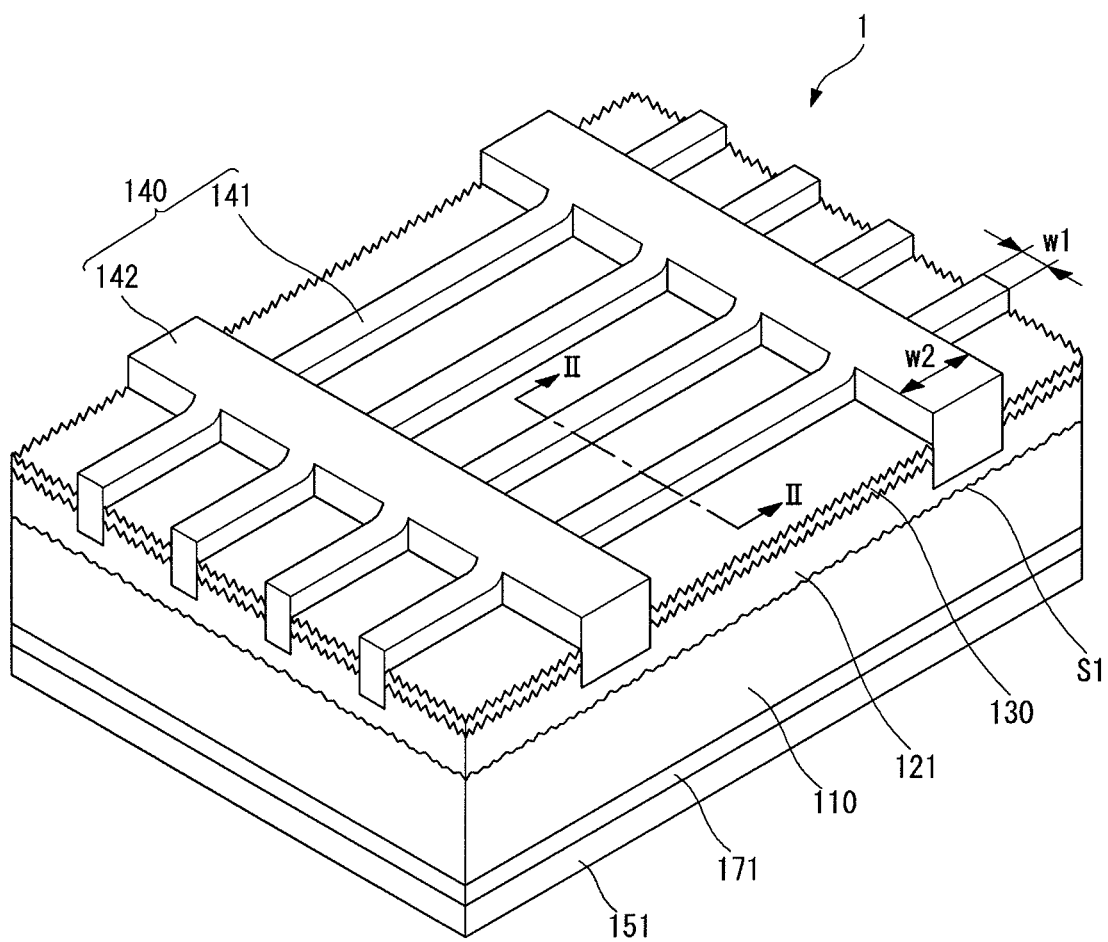
FIG. 1 is a perspective view of a solar cell according to an example embodiment of the invention.

The invention will be described more fully hereinafter with reference to the accompanying drawings, in which example embodiments of the inventions are shown. This invention may, however, be embodied in many different forms and should not be construed as limited to only the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Referring to the drawings, a solar cell according to an example embodiment of the present invention will be described.

Figure 2:
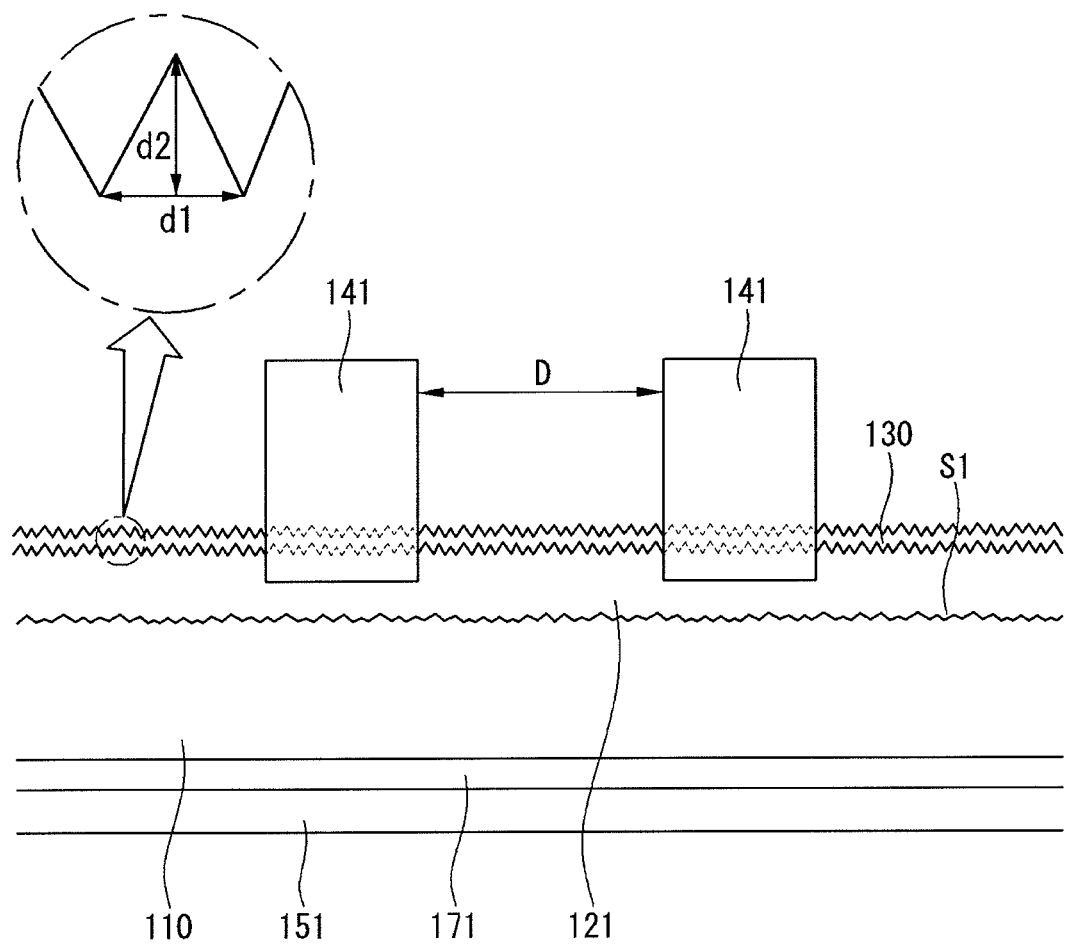
FIG. 2 is a cross-sectional view taken along a line II-II of FIG. 1.

FIG. 1 is a perspective view of a solar cell according to an example embodiment of the invention and FIG. 2 is a cross-sectional view taken along a line II-II of FIG. 1.

Referring to FIGS. 1 and 2, a solar cell 1 according to an example embodiment of the invention includes a substrate 110, an emitter region 121 positioned in (at) a surface (hereinafter, referred to as 'a front surface') of the substrate 110 on which light is incident, an anti-reflection layer 130 on the emitter region 120, a front electrode unit 140 positioned on the front surface of the substrate 110 and connected to the emitter region 121, a rear electrode 151 positioned on a surface (a rear surface) of the substrate 110, opposite the front surface of the substrate 110, on which the light is not incident and connected to the substrate 110, and a back surface field (BSF) region 171 positioned between the substrate 110 and the rear electrode 151.

The substrate 110 is a semiconductor substrate, and may be formed of first conductive type silicon, for example, p-type silicon, though not required. In the embodiment, the silicon is polycrystalline silicon, but the silicon may be single crystal silicon or others in other embodiments. If the substrate 110 is of the p-type, a group III element impurity such as boron (B), gallium (Ga), and indium (In) may be doped in the substrate 110. Alternatively, the substrate 110 may be of an n-type. If the substrate 110 is of the n-type, a group V element impurity such as phosphorus (P), arsenic (As), and antimony (Sb) may be doped in the substrate 110. Alternatively, the substrate 110 may be a material other than silicon.

The emitter region 121 is an impurity region containing an impurity (e.g., an n-type impurity) of a second conductive type opposite the first conductive type of the substrate 110. The emitter region 121 is substantially positioned in (at) the entire front surface of the substrate 110, on which light is incident.

In this embodiment, the emitter region 121 has a sheet resistance of about 80 Ω/sq. to 150 Ω/sq. A deviation of the sheet resistance according to a position variation in the emitter region 121 of the embodiment is about ±15 Ω/sq., in a unit area of about 10 μm×10 μm. The unit area for measuring the deviation of the sheet resistance may be varied.

Further, the emitter region 121 has a thickness of about 150 nm to 450 nm.

However, as the sheet resistance of the emitter region 121 increases, an impurity doped depth of the emitter region 121 becomes thin. Thereby, and more specifically, for preventing or reducing a problem generated due to the thin impurity doped depth when the front electrode unit 140 is connected to the substrate 110 through the emitter region 121 during a process for forming the front electrode unit 140, the emitter region 121 has the sheet resistance of about 100 Ω/sq.

The emitter region 121, that is, the front surface of the substrate 110, is textured to form a textured surface that is an uneven surface. Though somewhat exaggerated in FIGS. 1 and 2 for purposes of illustration, the textured surface includes a plurality of jagged portions as shown. The front surface of the substrate 110 is etched by a dry etching method such as a reaction ion etching (RIE) method to form the textured surface.

Each of the jagged portions may have diameter (i.e., the maximum diameter) and the height of hundreds of nanometers, for example, that are equal to or less than 1 μm, such as about 300 nm (0.3 μm) to 800 nm (0.8 μm).

Since a size of each jagged portion is small, such as hundreds of nanometers, and is of a sub-micron size, a refractive index from the apex of each jagged portion to the substrate 110 is changed, for example, gradually or abruptly. That is, an upper portion of the jagged portion has a refractive index similar to that of air, while a lower portion of the jagged portion has a refractive index similar to that of silicon (Si) contained in the substrate 110. Thus, in each jagged portion, a layer stack effect obtained by stacked layers with different refractive index being continuously changed is generated.

Since the refractive index is changed according to the position change in each jagged portion by the layer stack effect, the wavelength of light absorbed into the substrate 110 also changed, and thereby the wavelength range of light that is incident on (or absorbed in) the substrate 110 also increases. Thus, by the textured surface of the embodiment, reflectance (for example, average weighted reflectance) of light in the wavelength range of about 300 nm to 1100 nm is about 10% or less. Accordingly, an anti-reflection efficiency of light increases to improve an efficiency of the solar cell 1.

The sheet resistance of the emitter region 121 in this embodiment is greater than that of an emitter region according to a comparative example (or a convention example), and the thickness (the impurity doped depth) of the emitter region 121 in this embodiment is less than that of the emitter region of the comparative example. The emitter region according to the comparative example is formed on a textured surface that is formed on the surface of a substrate by a wet etching method and has a plurality of projections with a size (a diameter (d1) and/or a height (d2)) that is of micrometers.

For example, the emitter region of the comparative example has a sheet resistance of about 50 Ω/sq. to 70 Ω/sq., and a thickness of about 300 nm to 500 nm.

Thus, since the thickness of the emitter region 121 influences (or is influenced by) process conditions such as a process temperature and a process time, etc., given the same process temperate, and as the thickness of the emitter region 121 decreases, the time it takes for forming the emitter region 121 becomes shorter.

The emitter region 121 forms a p-n junction with the substrate 110. In this instance, the boundary portion, that is, a p-n junction portion, between the substrate 110 and the emitter region 121 also has an uneven surface similar to the textured surface of the substrate 110.

During operation of the solar cell 1, by a built-in potential difference generated due to the p-n junction, a plurality of electron-hole pairs, which are generated by incident light on the semiconductor substrate 110, are separated into electrons and holes, respectively, and the separated electrons move toward the n-type semiconductor and the separated holes move toward the p-type semiconductor. Thus, when the substrate 110 is of the p-type and the emitter region 121 is of the n-type, the separated holes move toward the substrate 110 and the separated electrons move toward the emitter region 121.

Because the emitter region 121 forms the p-n junction with the substrate 110, when the substrate 110 is of the n-type, then the emitter region 121 is of the p-type, in contrast to the embodiment discussed above, so that the separated electrons move toward the substrate 110 and the separated holes move toward the emitter region 121.

Additionally, when the emitter region 121 is of the n-type, the emitter region 121 may be formed by doping the substrate 110 with the group V element impurity such as P, As, Sb, etc., while when the emitter region 121 is of the p-type, the emitter region 121 may be formed by doping the substrate 110 with the group III element impurity such as B, Ga, In, etc.

In reference to FIGS. 1 and 2, the anti-reflection layer 130 positioned on the emitter region 121 is preferably, but not necessarily, made of silicon nitride (SiNx) or silicon oxide (SiOx), etc. The anti-reflection layer 130 reduces reflectance of light incident on the substrate 110 and increases selectivity of a specific wavelength band, thereby increasing the efficiency of the solar cell 1.

The anti-reflection layer 130 also performs a passivation function to change defects such as dangling bonds, mainly existing at the surface portion of the substrate 110, into stable bonds to reduce charge disappearance caused by the defects.

When the anti-reflection layer 130 is made of silicon nitride (SiNx), the anti-reflection layer (SiNx layer) 130 has an electric characteristic of a positive charge, and the anti-reflection layer 130 disturbs the hole movement toward the front surface of the substrate 110, but attracts the electrons toward the front surface of the substrate 110, to thereby improve the transmission efficiency of the charges (i.e., the electrons).

In this embodiment, the anti-reflection layer 130 has a single-layered structure, but the anti-reflection layer 130 may have a multi-layered structure such as a double-layered structure in other embodiments. The anti-reflection layer 130 may be omitted, if desired.

As shown in FIG. 1, the front electrode unit 140 includes a plurality of front electrodes 141 and a plurality of charge collectors (hereinafter, referred to as 'a plurality of front electrode charge collectors') for the front electrodes 142.

The plurality of front electrodes 141 are physically and electrically connected to the emitter region 121 and are spaced apart from each other by a predetermined distance to be parallel to each other. The front electrodes 141 collect charges, for example, electrons, moving toward the emitter region 121.

In the embodiment, an aspect ratio (a ratio of thickness to width) of each front electrode 141 is about 1 to 1.5. In this instance, each of the front electrodes 141 may have a width (w1) of about 0.02 mm (20 μm) to 0.08 mm (80 μm) and have a thickness (or height) of about 0.03 mm (30 μm) to 0.08 mm (80 μm). In this instance, the thickness of the front electrode 141 is measured at an approximately middle portion of the front electrode 141 that is between two adjacent front electrode charge collectors 142. Further, a distance (D) between two adjacent front electrodes 141 may be approximately 1.6 mm (1600 μm) to 2.0 mm (2000 μm). In this instance, a distance of two adjacent front electrodes according to the comparative example is about 2.1 to 2.3 mm.

As described above, the width of each front electrode 141 is less than that of each front electrode of the comparative example, but the thickness of each front electrode 141 is more than that of each front electrode of the comparative example.

For example, each front electrode according to the comparative example has a width of about 0.08 mm to 0.12 mm and a thickness of about 0.015 mm to 0.025 mm.

As described above, in the comparative example, the size of each projection of the textured surface is of micrometers dimensions, and thereby the emitter region at the substrate is formed along in the shape of the textured surface. Further, by characteristics of a process for forming the emitter region, the thicknesses of portions of the emitter region which are formed at an apex portion of each projection of the textured surface, are greater than those of portions of the emitter region which are formed at a side portion or a lower portion of (or between) each projection (i.e. a valley portion) of the textured surface. Thereby, in the comparative example, the p-n junction portion is an uneven surface having unevenness that is about equal to the textured surface.

However, in this embodiment, each jagged portion formed at the textured surface has the size of hundreds of nanometers (or has nanometer dimensions). Thus, when the emitter region 121 is formed to have a thickness of about 300 nm to 500 nm similar to the emitter region of the comparative example, the emitter region 121 of the embodiment is formed into an internal portion of the substrate 110, at which the plurality of jagged portions are not formed, as well as at a portion with an uneven portion (the textured surface). That is, the emitter region will have a thickness of 300 nm to 500 nm from the textured surface, and the p-n junction portion S1 is close to being an almost flat surface. Thus, because the jagged portions of the embodiment is of a smaller size than that of the comparative example, the doping of the impurity (e.g., an n-type impurity) of a second conductive type into the substrate 110 is less affected by the presence of the jagged portions, and the emitter layer 121 is formed to have a substantially smooth p-n junction with substrate 110.

Thereby, when the textured surface is formed by use of the dry etching method as in the embodiment, but if the emitter region is formed to have the thickness of the comparative example, then a distance between the p-n junction portion (located in the depths of the substrate 110) and the surface of the substrate 110 is far larger than that of the comparative example, and the area of the emitter region also further increases as compared to the comparative example. Thus, an amount of light of a short wavelength range which does not reach the p-n junction portion increases, and thereby there is a problem of reduced current amount generated by the light of the short wavelength range.

However, since the thickness of the emitter region 121 is reduced in this embodiment, the current loss by light of the short wavelength range not reaching the p-n junction is reduced or prevented. In this instance, as compared to the comparative example, the sheet resistance of the emitter region 121 increases due to the thickness reduction of the emitter region 121, and the surface area of the textured surface is also increased by the size of the jagged portions having dimensions of hundreds of nanometers. Thereby, the movement distance of charges mainly moving along the surface of the substrate 110 and the sheet resistance may increase, and thereby the charge disappearance may be occurring.

However, in this embodiment, the distance between two adjacent front electrodes 141 is shortened in comparison to the comparative example. Thus, the movement distance of the charges moving to adjacent front electrodes 141 is reduce to decrease or prevent the charge disappearance.

In this embodiment, the number of front electrodes 141 is increased by the shortened distance between two adjacent front electrodes 141, and thereby the incident area of light is reduced. However, since the width of each front electrode 141 is also reduced, the incident area of light is not so reduced to prevent the loss of light incident on the substrate 110. In this instance, since the thickness of each front electrode 141 is increased, the increase of contact resistance between the emitter region 121 and the front electrodes 141 is prevented or reduced.

Additionally, as shown in FIGS. 1 and 2, the plurality of first electrodes 141 are formed over the plurality of jagged portions so that a number of the plurality of jagged portions are disposed within a cross sectional width direction of the plurality of first electrodes 141. In the embodiment, the number of such jagged portions is at least 10. Similar or greater number of jagged portions is disposed within a cross sectional width direction of the plurality of first electrode charge collectors 142.

As described above, although the sheet resistance of the emitter region 121 is increased by the size decrement of each jagged portion so as to have high sheet resistance characteristics, the charge disappearance by the incremented sheet resistance of the emitter region 121 and the enlarged surface area of the substrate 110 are prevented or reduced, and the decrement of the incident area of light and the decrement of the charges amount transmitted from the emitter region 121 and the front electrodes 141 are also prevented or reduced.

When the width and thickness of each front electrode 141 is lower than a lower limit, the front electrodes 141 do not normally function, and when the width and thickness of each front electrode 141 exceed an upper limit, the width of each front electrode 141 are unnecessarily increased to reduce the incident area of light and waste the material of the front electrodes 141 thereby. In particular, when the thickness of each front electrode 141 exceeds the upper limit, the formation of the front electrodes 141 becomes difficult.

The plurality of front electrode charge collectors 142 extend in a direction crossing the front electrodes 141 and are electrically and physically connected to the plurality of front electrodes 141 as well as the emitter region 121.

In this instance, the plurality of front electrode charge collectors 142 are positioned on the same level layer as the front electrodes 141 and are electrically and physically connected to the plurality of front electrodes 141 at positions crossing each front electrode 141. Thereby, as shown in FIG. 1, each of the plurality of front electrodes 141 has a stripe shape extending in a horizontal or vertical direction and each of the plurality of front electrode charge collectors 142 has a stripe shape extending in a vertical or horizontal direction, and thereby the front electrode unit 140 is positioned to have a matrix structure at the front surface of the substrate 110.

The front electrode charge collectors 142 collect the charges, for example, electrons, transferred from the front electrodes 141. The front electrode charge collectors 142 are connected to an external device by a conductive tape, etc., and thereby output the collected charges to the external device through the conductive tape, etc.

Since each front electrode charge collector 142 collects and transfers the charges collected by the connected front electrodes 141 thereto, a width (w2) of each front electrode charge collector 142 is more than the width (w1) of each front electrode 141.

The width of the front electrode charge collector 142 and the distance between two adjacent front electrode charge collectors 142 may be changed based on the number of front electrode charge collectors 142.

For example, when the number of the front electrode charge collectors 142 is two, the width of each front electrode charge collector 142 may be about 1.9 mm to 2.2 mm and the distance between two adjacent front electrode charge collectors 142 may be about 50 mm to 55 mm. When the number of the front electrode charge collectors 142 is three, the width of each front electrode charge collector 142 may be about 1.3 mm to 1.7 mm and the distance between two adjacent front electrode charge collectors 142 may be about 25 mm to 30 mm.

In detail, when the width of each front electrode 141 is about 0.02 mm, the width of each front electrode charge collector 142 may be about 1.3 mm to 2.2 mm, and when the width of each front electrode 141 is about 0.08 mm, the width of each front electrode charge collector 142 may be about 1.3 mm to 2.2 mm.

Thereby, a ratio of the width of the front electrode 141 to the width of the front electrode charge collector 142 may be 1:about 16.25 to 110.

In this embodiment, regardless of the number of front electrode charge collectors 142, the thickness of each front electrode charge collector 142 is equal to or greater than that of each front electrode 141.

For example, the thickness of each front electrode charge collector 142 may be about 0.035 mm (35 μm) to 1.0 mm (1000 μm). More specifically, when the thickness of the front electrode is about 0.03 mm, the thickness of the front electrode charge collector 142 may be 0.035 mm to 1.0 mm, and when the thickness of the front electrode is about 0.08 mm, the thickness of the front electrode charge collector 142 may be about 0.08 mm to 1.0 mm. Thereby, a ratio of the thickness of the front electrode 141 to the thickness of the front electrode charge collector 142 may be 1:about 1 to 3.3.

A thickness difference between the front electrode 141 and the front electrode charge collector 142 is generated because the width of the front electrode charge collector 142 is larger than that of the front electrode 141.

Generally, in forming the front electrode unit 140, a paste containing Ag and Pb, etc., is printed on the anti-reflection layer 130 of the substrate 110 using a screen printing method to form a paste pastern for the front electrode unit 140, and then the substrate 110 with the printed paste pattern is heated at a predetermined temperature in a thermal process. In the thermal process, portions of the anti-reflection layer 130 are etched by a Pb component contained in the paste pattern, and thereby the paste pattern comes in contact with the emitter region 121 to form the front electrode unit 140 contacting the emitter region 121.

Since portions of the anti-reflection layer 130 are etched by the Pb component contained in the paste pattern, the plurality of jagged portions are disposed within the cross sectional width direction of the plurality of first electrode charge collectors 142 and/or a cross sectional width direction of the plurality of first electrodes.

In this instance, since the width of the front electrode 141 is far less than that of the front electrode charge collector 142, during processes for forming the front electrode unit 140 such as the thermal process, a thickness reduction amount of a portion of the paste pattern for the front electrodes 141 is larger than that of a portion of the paste pattern for the front electrode charge collectors 142. Thereby, the thickness of the front electrode 141 is equal to or less than that of the front electrode charge collector 142.

Alternatively, the paste for forming the front electrode unit 140 need not contain Pb. In this instance, the front electrode unit 140 is formed using a paste containing an environment-friendly material that will perform the function of Pb instead, or by using other means for forming the paste pattern. Thus, environment pollution is prevented or reduced.

When the front electrode unit 140 is formed using the paste containing Pb, the front electrode unit 140 then includes Pb, while when the front electrode unit 140 is formed using the paste not containing Pb, then Pb is not detected in the front electrode unit 140.

Compared to the comparative example, since only the thickness from among the thickness and the width of the front electrode charge collector 142 increases, an aspect ratio of the front electrode charge collector 142 also increases.

Alternatively, the front electrode unit 140 including the plurality of front electrode 141 and the plurality of front electrode charge collectors 142 may be made of at least one conductive material selected from the group consisting of nickel (Ni), copper (Cu), aluminum (Al), tin (Sn), zinc (Zn), indium (In), titanium (Ti), gold (Au), and a combination thereof. Other conductive metal materials may be used.

The number of front electrodes 141 and front electrode charge collectors 142 is only an example, and thereby may be changed.

Due to the front electrode unit 140 being connected to the emitter region 121, the anti-reflection layer 130 is mainly positioned on portions of the first emitter region 121, on which the front electrode unit 140 is not positioned.

By varying the number of times the paste is printed on the anti-reflection layer 130, etc., the front electrode unit 140 is formed to have a thickness and/or width.

The rear electrode 151 is substantially positioned on the entire rear surface of the substrate 110.

The rear electrode 151 contains a conductive material such as aluminum (Al) and is connected to the substrate 110.

The rear electrode 151 collects charges, for example, holes, moving toward the substrate 110 and output the charges to the external device.

Alternatively, the rear electrode 151 may be made of a conductive material of at least one selected from the group consisting of Ni, Cu, Ag, Sn, Zn, In, Ti, Au, and a combination thereof. Other conductive materials may be used.

The back surface field region 171 positioned between the rear electrode 151 and the substrate 110 is an area heavily doped by an impurity of the same conductive type as the substrate 110, and thereby, in this embodiment, the back surface field region 171 may be a p$^+$-type area having an impurity doped concentration heavier than that of the substrate 110.

A potential barrier is formed by an impurity doped concentration difference between the substrate 110 and the back surface field region 171, thereby disturbing the movement of charges (for example, electrons) to a rear portion of the substrate 110. Accordingly, the back surface field region 171 prevents or reduces the recombination and/or the disappearance of the separated electrons and holes at the rear surface of the substrate 110.

The solar cell 1 may further include a plurality of charge collectors (a plurality of rear electrode charge collectors) for the rear electrode 151 positioned on the rear surface of the substrate 110.

Similar to the front electrode charge collectors 142 of the front electrode unit 140, the plurality of rear electrode charge collectors are electrically connected to the substrate 110 to collect the charges transferred from the rear electrode 151 and output the charges to the external device. The plurality of rear electrode charge collectors are positioned to correspond to the front electrode charge collectors 142 of the front electrode unit 140. The plurality of rear electrode charge collectors may be made of a material with conductivity greater than that of the front electrode 151. For example, the plurality of rear electrode charge collectors contain at least one conductive material such Ag.

In this embodiment, a paste for forming the rear electrode 151 and the rear electrode charge collectors contains Al and/or Ag, but does not contain Pb.

An operation of the solar cell 1 of the structure will be described in detail.

When light irradiated to the solar cell 1 is incident on the substrate 110 of the semiconductor through the anti-reflection layer 130 and the emitter region 121, a plurality of electron-hole pairs are generated in the substrate 110 by light energy based on the incident light. In this instance, since a reflection loss of light incident onto the substrate 110 is reduced by the anti-reflection layer 130 and the textured surface of the substrate 110, an amount of the light that is incident on the substrate 110 increases.

The electron-hole pairs are separated by the p-n junction of the substrate 110 and the emitter region 121, and the separated electrons move toward the emitter region 121 of the n-type and the separated holes move toward the substrate 110 of the p-type. The electrons that move toward the emitter region 121 are mainly collected by the front electrodes 141 and moves along the front electrode charge collectors 142, while the holes that move toward the substrate 110 are collected by the rear electrode 151. When the front electrode charge collectors 142 and the rear electrode 151 are connected to electric wires, current flows therein to thereby enable use of the current for electric power.

Since the widths of the front electrodes 141 are reduced, the light incident area of the solar cell 1 increases to improve an efficiency of the solar cell 1. In this instance, the wire resistance of the front electrodes 141 does not increase due to the offsetting thickness increment of the front electrodes 141.

Although such a solar cell 1 may be independently used, the plurality of solar cells 1 may be electrically connected in series or in parallel for more efficient use to form a solar cell module.

Next, a solar cell module using the solar cell 1 according to an example embodiment of the present invention will be described with reference to FIG. 3.

Figure 3:
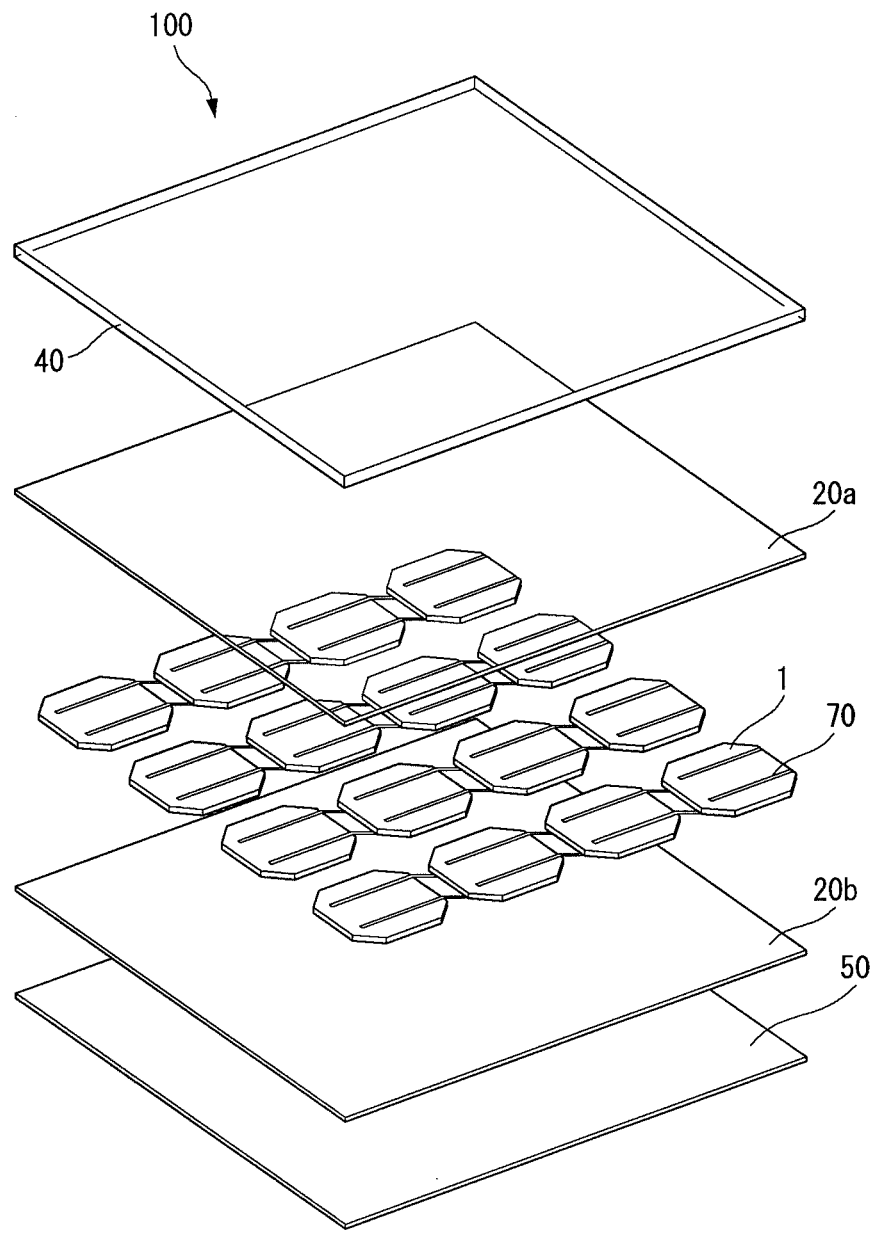
FIG. 3 is a schematic view showing a solar cell module according to an example embodiment of the present invention.

FIG. 3 is a schematic view showing a solar cell module according to an example embodiment of the present invention.

Referring to FIG. 3, the solar cell module 100 according to this example embodiment includes a plurality of solar cells 1, protection films 20a and 20b for protecting the solar cells 1, a transparent member 40 positioned on the protection film 20a (hereinafter, 'an upper protection film') positioned on the light receiving surface of the solar cell 1, and a back sheet 50 disposed under the protection film 20b (hereinafter, 'a lower protection film') positioned on the opposite side of the light receiving surface on which light is not incident.

The back sheet 50 prevents moisture from permeating to the back surface of the solar cell module 100 and hence protects the solar cells 1 from an outside environment. The back sheet 50 of this type may have a multilayered structure, such as a layer for preventing permeation of moisture and oxygen, a layer for preventing chemical corrosion, and a layer having insulation characteristics. etc.

The upper and lower protection films 20a and 20b prevent the corrosion of metals caused by moisture permeation and protect the solar cell module 100 from an impact. The upper and lower protection films 20a and 20b of this type are integrated with the solar cells 1 during a lamination process, and are disposed on the upper and lower portions of the solar cells 1. These protection films 20a and 20b may be made of ethylene vinyl acetate (EVA) and the like.

The transparent member 40 positioned on the upper protection film 20a is made of tempered glass having high transmittance and excellent damage prevention function. In this instance, the tempered glass may be a low iron tempered glass having a low iron content. The inner surface of the transparent member 40 may be embossed in order to increase light scattering effect. Other materials for the transparent member 40 may be used.

The solar cells 1 are arranged in a matrix structure. In FIG. 3, the solar cells 1 has a 4×4 matrix structure, but the embodiment is not limited thereto and the number of solar cells 1 disposed in respective row and column directions may be adjusted if required. The solar cells 1 are electrically connected in series to neighboring solar cells 1 by a plurality of connectors 70.

The plurality of connectors 70 contain a conductive material and is a ribbon shape.

The solar cell module 100 is manufactured by a method sequentially including testing the plurality of solar cells 1, electrically connecting the tested solar cells 1 to one another using the connectors 70, successively disposing the back sheet 50, the lower passivation layer 20b, the solar cells 1, the upper passivation layer 20a, and the transparent member 40 from the bottom of the solar cell module 100 in the order named, performing the lamination process in a vacuum state to form an integral body of the components 1, 20a, 20b, 40, and 50, performing an edge trimming process, testing the completed solar cell module 100, and the like.

The solar cell module 100 integrated as one product by the laminating process is housed by a frame and thereby protected from the outside environment or an impact. The frame may be made of a material preventing the corrosion or deformation due to the outside environment, such as aluminum coated by an insulating material, and may have a structure by which drainage, installation and construction are easily performed.

The solar cell module 100 further includes a junction box positioned under back sheet 50. The junction box finally collects current and voltage generated in the solar cells 1.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell, comprising:
a substrate having a textured surface, the textured surface comprising a plurality of jagged portions;
an emitter region forming a p-n junction with the substrate at a p-n junction portion;
an anti-reflection layer on the emitter region;
a plurality of first electrodes directly contacted to the emitter region through the anti-reflection layer;
a plurality of first electrode charge collectors connected to the emitter region through the anti-reflection layer and extending in a direction crossing the plurality of first electrodes; and
a second electrode connected to the substrate,
wherein each of the plurality of jagged portions has a diameter and a height of 300 nm to 800 nm thereby the emitter region has a thickness of 150 nm to 450 nm beginning from the textured surface of the substrate and has a sheet resistance of 80Ω/sq. to 150Ω/sq.,
wherein a distance between two adjacent first electrodes among the plurality of first electrodes is equal to or greater than 1.6 mm and equal to or less than 2.0 mm configured to decrease a charge disappearance caused by an increased sheet resistance of the emitter region,
wherein each of the plurality of first electrodes has a width of 20 μm to 80 μm and a height of 30 μm to 80 μm, and each of the plurality of first electrodes has an aspect ratio greater than 1 to being equal to 1.5, and
wherein the p-n junction portion is flatter than the textured surface of the substrate.

2. The solar cell of claim 1, wherein each of the plurality of first electrode charge collectors has a thickness of 35 μm to 100 μm.

3. The solar cell of claim 1, wherein each of the plurality of first electrode charge collectors has a width of 1.3 mm to 2.2 mm.

4. A solar cell, comprising:
a substrate having a textured surface, the textured surface comprising a plurality of jagged portions;
an emitter region forming a p-n junction with the substrate at a p-n junction portion;
an anti-reflection layer on the emitter region;
a plurality of first electrodes directly contacted to the emitter region through the anti-reflection layer;
a plurality of first electrode charge collectors connected to the emitter region through the anti-reflection layer and extending in a direction crossing the plurality of first electrodes; and
a second electrode connected to the substrate,
wherein at least one of the plurality of first electrodes is formed over the plurality of jagged portions, and a number of the plurality of jagged portions disposed within a cross sectional width direction of the at least one of the plurality of first electrodes is at least 10,
wherein each of the plurality of jagged portions has a diameter and a height of 300 nm to 800 nm, thereby the emitter region has a thickness of 150 nm to 450 nm beginning from the textured surface of the substrate and has a sheet resistance of 80Ω/sq. to 150Ω/sq.,
wherein a distance between two adjacent first electrodes among the plurality of first electrodes is equal to or greater than 1.6 mm and equal to or less than 2.0 mm configured to decrease a charge disappearance caused by an increased sheet resistance of the emitter region,
wherein each of the plurality of first electrodes has a width of 20 μm to 80 μm and a height of 30 μm to 80 μm, and each of the plurality of first electrodes has an aspect ratio greater than 1 to being equal to 1.5, and
wherein the p-n junction portion is flatter than the textured surface of the substrate.

5. The solar cell of claim 1, wherein a thickness of each of the plurality of first electrode charge collectors is greater than a thickness of the each of the plurality of first electrodes.

6. The solar cell of claim 1, wherein each of the plurality of first electrode charge collectors has a height equal to or greater than the height of each of the plurality of first electrodes.

7. The solar cell of claim 6, wherein a ratio of a thickness of the each of the plurality of first electrodes with respect to a thickness of the each of the plurality of first electrode charge collectors is 1:1 to 3.3.

8. The solar cell of claim 6, wherein a ratio of the width of the each of the plurality of first electrodes with respect to a width of the each of the plurality of first electrode charge collectors is 1:16.25 to 110.

9. The solar cell of claim 4, wherein each of the plurality of first electrode charge collectors has a thickness of 35 μm to 100 μm.

10. The solar cell of claim 4, wherein each of the plurality of first electrode charge collectors has a width of 1.3 mm to 2.2 mm.

11. The solar cell of claim 5, wherein a ratio of the thickness of the each of the plurality of first electrodes with respect to the thickness of the each of the plurality of first electrode charge collectors is 1:1 to 3.3.

12. The solar cell of claim 5, wherein a ratio of the width of the each of the plurality of first electrodes with respect to a width of the each of the plurality of first electrode charge collectors is 1:16.25 to 110.

13. The solar cell of claim 1, wherein a width of a front electrode charge collector and a distance between two adjacent front electrode charge collectors are changed based on a number of the front electrode charge collectors, and
wherein when the number of the plurality of front electrode charge collectors increases, the width of the front electrode charge collector decreases and the distance between the two adjacent front electrode charge collectors narrows.

14. The solar cell of claim 4, wherein a width of a front electrode charge collector and a distance between two adjacent front electrode charge collectors are changed based on a number of the front electrode charge collectors, and
wherein when the number of the plurality of front electrode charge collectors increases, the width of the front electrode charge collector decreases and the distance between the two adjacent front electrode charge collectors narrows.

15. The solar cell of claim 3, wherein a distance between a bottom surface of one first electrode and a border at which the substrate and the emitter region are divided in a thickness direction of the substrate is smaller than the thickness of the emitter region.

16. The solar cell of claim 4, wherein a distance between a bottom surface of one first electrode and a border at which the substrate and the emitter region are divided in a thickness direction of the substrate is smaller than the thickness of the emitter region.

17. The solar cell of claim 1, wherein some of the plurality of jagged portions are disposed within the plurality of first electrode charge collectors, and
wherein a thickness of the each of the plurality of first electrodes is greater than the width of the each of the plurality of first electrodes.

18. The solar cell of claim 4, wherein some of the plurality of jagged portions are disposed within the plurality of first electrode charge collectors, and
wherein a thickness of the each of the plurality of first electrodes is greater than the width of the each of the plurality of first electrodes.

* * * * *